(12) United States Patent
Saito et al.

(10) Patent No.: US 9,978,701 B2
(45) Date of Patent: May 22, 2018

(54) SEMICONDUCTOR DEVICE

(71) Applicant: FUJI ELECTRIC CO., LTD., Kawasaki-shi (JP)

(72) Inventors: Takashi Saito, Matsumoto (JP); Fumihiko Momose, Nagano (JP); Kazumasa Kido, Matsumoto (JP); Yoshitaka Nishimura, Azumino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days. days.

(21) Appl. No.: 14/845,247

(22) Filed: Sep. 3, 2015

(65) Prior Publication Data

US 2016/0035683 A1 Feb. 4, 2016

Related U.S. Application Data

(63) Continuation of application No. PCT/JP2014/061458, filed on Apr. 23, 2014.

(30) Foreign Application Priority Data

May 10, 2013 (JP) ................. 2013-100652

(51) Int. Cl.
*H01L 23/00* (2006.01)

(52) U.S. Cl.
CPC .............. *H01L 24/05* (2013.01); *H01L 24/03* (2013.01); *H01L 24/45* (2013.01); *H01L 24/48* (2013.01); *H01L 24/85* (2013.01); *H01L 2224/0345* (2013.01); *H01L 2224/0381* (2013.01); *H01L 2224/03462* (2013.01); *H01L 2224/03464* (2013.01); *H01L 2224/04042* (2013.01); *H01L 2224/05073* (2013.01); *H01L 2224/05124* (2013.01); *H01L 2224/05655* (2013.01); *H01L 2224/291* (2013.01); (Continued)

(58) Field of Classification Search
CPC ......... H01L 24/03; H01L 24/05; H01L 24/45; H01L 24/85; H01L 21/02378; H01L 21/02529; H01L 29/1608
USPC ..................................... 257/77, 773
See application file for complete search history.

(56) References Cited

U.S. PATENT DOCUMENTS

2011/0256668 A1* 10/2011 Urano ................ H01L 21/6836
438/114
2016/0035683 A1* 2/2016 Saito ...................... H01L 24/85
257/77

FOREIGN PATENT DOCUMENTS

JP 2002-222826 A 8/2002
JP 2004-087772 A 3/2004
(Continued)

*Primary Examiner* — Walter H Swanson
(74) *Attorney, Agent, or Firm* — Rabin & Berdo, P.C.

(57) ABSTRACT

A highly reliable semiconductor device capable of heavy current conduction and high temperature operation has a module structure in which a semiconductor chip and a circuit pattern are electrically connected via a wire. A front surface metal film is formed on a front surface electrode of the chip, and the wire is bonded to the front surface metal film by wire bonding. The chip has a front surface electrode on the front surface of an Si substrate or an SiC substrate, and has a rear surface substrate on the rear surface thereof. The front surface metal film is a Ni film or a Ni alloy film of having a thickness ranging from 3 μm to 7 μm. The wire is an Al wire having an increased recrystallizing temperature and improved strength due to controlling the crystal grain sizes before wire bonding to a range of 1 μm to 20 μm.

7 Claims, 15 Drawing Sheets

(52) U.S. Cl.
CPC .............. *H01L 2224/32225* (2013.01); *H01L 2224/45015* (2013.01); *H01L 2224/45124* (2013.01); *H01L 2224/45147* (2013.01); *H01L 2224/48091* (2013.01); *H01L 2224/48105* (2013.01); *H01L 2224/48227* (2013.01); *H01L 2224/48755* (2013.01); *H01L 2224/48855* (2013.01); *H01L 2224/73265* (2013.01); *H01L 2224/83447* (2013.01); *H01L 2224/85203* (2013.01); *H01L 2224/85205* (2013.01); *H01L 2224/92147* (2013.01); *H01L 2924/00014* (2013.01); *H01L 2924/10253* (2013.01); *H01L 2924/10272* (2013.01)

(56) References Cited

FOREIGN PATENT DOCUMENTS

| | | | |
|---|---|---|---|
| JP | 2004-179484 | * | 6/2004 |
| JP | 2004-200644 | A | 7/2004 |
| JP | 2009-076703 | | 4/2009 |
| JP | 5159000 | * | 3/2013 |

\* cited by examiner

FIG. 5

|  |  | ULTRASONIC OUTPUT (V) | | |
|---|---|---|---|---|
|  |  | 18 | 20 | 22 |
| BONDING LOAD (cN) | 1300 | ○ | ○ | ○ |
|  | 1400 | ○ | ○ | ○ |
|  | 1500 | ○ | ○ | ○ |

FIG. 6

|  |  | ULTRASONIC OUTPUT (V) | | |
|---|---|---|---|---|
|  |  | 18 | 20 | 22 |
| BONDING LOAD (cN) | 1300 | × | ○ | ○ |
|  | 1400 | ○ | ○ | ○ |
|  | 1500 | × | ○ | ○ |

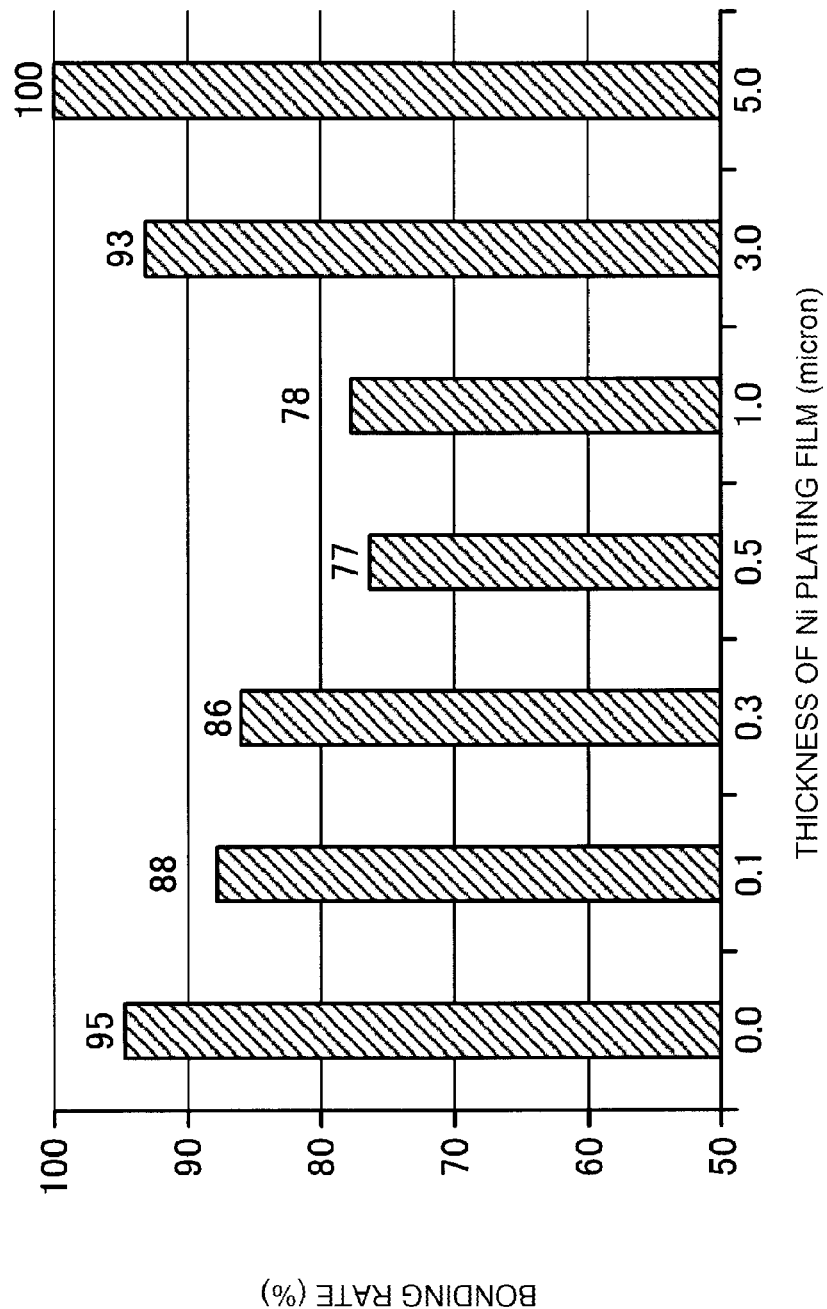

Al ELECTRODE (NO Ni PLATING FILM)

21a  7a  12a

THICKNESS OF Ni PLATING FILM =0.3μm 22b  21b  7b  14b

THICKNESS OF Ni PLATING FILM =5.0μm

SEMICONDUCTOR DEVICE

CROSS-REFERENCE TO RELATED APPLICATION(S)

This non-provisional Application for a U.S. Patent is a Continuation of International Application PCT/JP2014/061458 filed Apr. 23, 2014, which claims priority from JP PA 2013-100652 filed May 10, 2013, the entire contents of both of which are hereby incorporated by reference.

BACKGROUND OF THE INVENTION

1. Field of the Invention

The present invention relates to a semiconductor device.

2. Background of the Related Art

Among semiconductor devices having a module structure which are used for general-purpose invertors, wind power generation, solar power generation and electric railroads, a semiconductor device having a module structure, where a front surface electrode of a semiconductor element and a circuit pattern are electrically connected (bonded) by wire bonding using aluminum (Al) wire or the like, is known. The front surface electrode of the semiconductor device having a module structure is an Al electrode or a copper (Cu) electrode, for example, and a circuit pattern is constituted by such a conductor as Cu.

Another semiconductor device having a module structure that is proposed has a configuration, where a nickel (Ni) plating film, a stacked film of Ni plating film and gold (Au) plating film, or a staked film of Ni plating film, a palladium (Pd) plating film and Au plating film is formed on a surface of an Al electrode, and an Al wire is wire-bonded to this plating film, or a lead frame is soldered to this plating film instead of Al wire bonding. The structure of the conventional semiconductor device having a module structure will be described.

FIG. 14 is a cross-sectional view depicting a structure of the conventional semiconductor device having a module structure. FIG. 15 is a cross-sectional view schematically depicting the structure of the semiconductor element in FIG. 14. As illustrated in FIG. 14 and FIG. 15, the conventional semiconductor device having a module structure has a semiconductor chip (semiconductor element) 101, an insulated substrate 102, a Cu base 106 and an Al wire 107. In the insulated substrate 102, a circuit pattern 104 constituted by Cu is disposed on the front surface side of an insulating layer 103, and a rear copper foil 105 is disposed on the rear surface side thereof.

The semiconductor chip 101 has a front surface electrode 112 constituted by Al or Cu on the front surface of a semiconductor substrate 111, and has a rear surface electrode 113 on the rear surface. The rear surface electrode 113 of the semiconductor chip 101 is bonded with the circuit pattern 104 via a solder bonding layer 101a. The front surface electrode 112 of the semiconductor chip 101 is electrically connected to the circuit pattern 104 by wire bonding using an Al wire 107 or the like.

An Al wire 107 is bonded using ultrasonic vibration, and good bonding is implemented without generating a connection failure by optimizing such conditions as heat, ultrasonic vibration and pressure with respect to the wire diameter of the Al wire 107. The wire diameter of the conventional Al wire 107 is about 300 µm to 400 µm. The bonding conditions between the front surface electrode 112 and the Al wire 107 change depending on the type of metal used for the front surface electrode 112 and the thickness of the front surface electrode 112. The front surface of the Cu base 106 is bonded with the rear copper foil 105 via a solder bonding layer (not illustrated).

As such a semiconductor device having a module structure, a device, of which surface glossiness of Ni plating film, which is formed on an electrode that is a target of performing Al wire-bonding and is constituted by a brass plate or Cu plate, is 1.6 or more, or the surface roughness of Ni plating plate, is 0.2 µm or less, and the thickness of Ni plating film is 2 µm or more, is proposed (e.g., see Japanese Patent Application Laid-open No. 2004-87772 (Patent Document 1)). Patent Document 1 discloses that the surface glossiness, the surface roughness and the plate thickness, among the characteristics of the Ni plating film, have a major influence on the strength of the Al wire bonding.

Another proposed device has a metal protecting film deposited on the surface of an Al electrode film, and an Al wire, which is electrically bonded with an Al electrode film via the metal protecting film by thermocompression bonding or ultrasonic vibration, where the metal protecting film is an Ni plating film having a 5 µm or less thickness deposited by an electroless plating method, and the thickness of the Ni plating film is not thicker than the thickness of the Al electrode film (e.g., see Japanese Patent Application Laid-open No. 2009-76703 (Patent Document 2)). Patent Document 2 discloses that solder bonding between the Al electrode film and the Al wire is enabled by the Ni plating film formed on the surface of the Al electrode film.

However as application areas expand, demands for heavier current conduction, higher temperature operation and improved reliability are increasing, and the following problem is generated. For example, the heavier current conduction can be handled by using a thicker Al wire (e.g. about 500 µm diameter), or by using a Cu wire of which conductivity is higher than that of the Al wire, but strength of the wire increases causing stress on the semiconductor chip when the wire is bonded to the surface of the front surface substrate, resulting in a deterioration of the semiconductor chip.

This problem is solved if the strength of the electrode portion is increased by forming an Ni film on the surface of the front surface electrode. However bonding of an Ni film and a wire involves the bonding of dissimilar metals, hence if conventional wire bonding conditions to bond similar metals (Al electrode and Al wire, Cu electrode and Cu wire) are used, a bonding failure (unbonded portion) is easily generated at the bonded interface between the Ni film and the wire, and the Ni film and the wire are not bonded perfectly.

A bonding failure is easily generated at the bonded interface of the Ni film and the wire because the material characteristics are different between Ni, which is the material of the Ni film, and Al or Cu, which is the material of the wire. Ni is harder and less extendable than Al and Cu, therefore stress applied on the Ni film is not easily dispersed, and the Ni film easily cracks during wire bonding. This means that the diameter of the wire, the thickness of the Ni film, and the bonding conditions between the Ni film and the wire are critical, but a detailed examination result of these aspects has not yet been disclosed.

Furthermore, in the case of conventional Al wire, a crystal structure in an area around the bonded interface with the front surface electrode becomes finer by the wire bonding, compared with the state before the wire bonding, whereby strength in an area near the bonded interface of the Al wire increases. However the crystal structure in an area near the bonded interface of the Al wire becomes larger and softer, depending on the thermal history in the manufacturing steps after the wire bonding and on the high temperature (e.g. 175° C.) operation due to the electric heating of the semiconductor elements. This makes it easier to generate cracking inside the Al wire.

The inventors conducted a power cycle test on the semiconductor device where an Al wire is bonded to the surface of the front surface electrode, and discovered that cracks are generated more inside the Al wire as a number of repeated cycles increases in the power cycle test, where finally the Al wire breaks down and separates, causing an element breakdown. Therefore development of a highly reliable semiconductor device, implementing heavy current conduction and high temperature operation is demanded by improving the tolerance to thermal load due to repeat heating and radiation (power cycle) during operation (hereafter called "power cycle tolerance (life duration)").

With the foregoing in view, it is an object of the present invention to provide a highly reliable semiconductor device which implements heavy current conduction and high temperature operation.

SUMMARY OF THE INVENTION

To solve the above problem and achieve the above object, the semiconductor device according to the present invention has the following features. A conducting unit is disposed on a surface of a semiconductor element. A metal film, having a 3 µm to 7 µm thickness, is disposed on a surface of the conducting unit. A wire having a wire diameter of 500 µm or larger is bonded to the metal film by wire bonding using ultrasonic vibration.

In the semiconductor device according to the present invention described above, the semiconductor element includes: a semiconductor substrate selected from a silicon substrate and a silicon carbide substrate; and a conducting unit, of which major component is aluminum, that is disposed on the surface of the semiconductor substrate.

In the semiconductor device according to the present invention described above, the main component of the metal film is nickel.

In the semiconductor device according to the present invention described above, the metal film is a nickel alloy film having, as a main component, nickel, and containing at least one of phosphorus and boron.

According to the present invention described above, the bonding strength and the bonding rate between the front surface metal film and the wire can be increased by bonding the wire to the front surface metal film, formed on the surface of the front surface electrode, by wire bonding using ultrasonic vibration. Thereby a good bonding state can be ensured between the front surface metal film and the wire, and wire separation can be prevented. As a consequence, the life duration of the semiconductor device can be improved even if the wire is made thicker, 500 µm or more, to improve conductivity.

According to the semiconductor device of the present invention, heavier current conduction and higher temperature operation can be implemented, and reliability can be improved.

BRIEF DESCRIPTION OF THE DRAWINGS

FIG. 5 is a table showing semiconductor chip characteristics of a semiconductor device according to Example 1 after wire bonding;

FIG. 6 is a table showing the semiconductor chip characteristics of a semiconductor device according to Comparative Example 1 after wire bonding;

FIG. 8 is a characteristic diagram depicting a bonding rate between the front surface metal film and the wire of the semiconductor device according to Example 2;

DETAILED DESCRIPTION OF THE INVENTION

Preferred embodiments of the semiconductor device according to this invention will now be described with reference to the accompanying drawings. In the description of the embodiments and accompanying drawings, a same composing element is denoted with a same reference symbol, and redundant description thereof is omitted.

Embodiment

Figure 1:
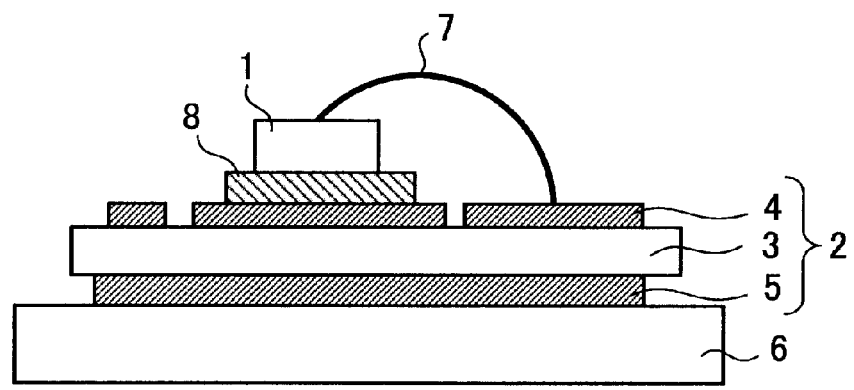
FIG. 1 is a cross-sectional view depicting a structure of a semiconductor device according to an embodiment.
Figure 2:
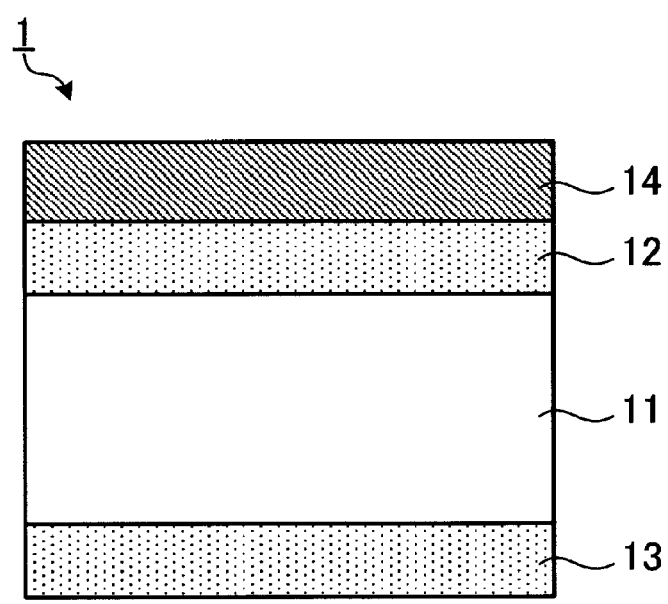
FIG. 2 is a cross-sectional view schematically depicting the structure of the semiconductor element in FIG. 1.

A structure of a semiconductor device according to an embodiment will be described. FIG. 1 is a cross-sectional view depicting a structure of the semiconductor device according to the embodiment. FIG. 2 is a cross-sectional view schematically depicting a semiconductor element in FIG. 1. As illustrated in FIG. 1 and FIG. 2, the semiconductor device according to this embodiment is a semiconductor device having a module structure, which includes a semiconductor chip (semiconductor element) 1, an insulated substrate 2, such as a ceramic insulated substrate (DCB substrate), a copper (Cu) base 6 and a wire 7. In the insulated substrate 2, a circuit pattern 4, constituted by Cu or the like, is disposed on the front surface side of an insulating layer 3, and a rear copper foil 5 is disposed on the rear surface side thereof.

The semiconductor chip 1 has a front surface electrode (conducting unit) 12 on the front surface of a semiconductor substrate (e. g. silicon (Si) substrate or a silicon carbide (SiC) substrate) 11, and has a rear surface electrode 13 on the rear surface thereof. The rear surface electrode 13 of the semiconductor chip 1 is bonded with the circuit pattern 4 via a solder bonding layer 8. The front surface of the Cu base 6 is bonded with the rear copper foil 5 via a solder bonding layer (not illustrated). To use the semiconductor device, the rear surface of the Cu base 6 is bonded with a cooling body via a thermal compound, although this is not illustrated. A resin case, in which an external terminal is disposed, is bonded with the periphery of the Cu base 6.

The front surface electrode 12 of the semiconductor chip 1 (hereafter simply called "front surface electrode") is an Al electrode or an Al alloy electrode, of which major component is aluminum (Al), for example. A front surface metal film 14 is formed on the surface of the front surface electrode 12 by electroless plating, electroplating, sputtering, deposition or the like. The front surface metal film 14 is a nickel (Ni) film, a Ni alloy film of which major component is Ni (Ni alloy film containing one of phosphorus (P) and boron (B), for example), or a Cu film, for example, and has a degree of hardness that is higher than that of the front surface electrode 12. The hardness of the front surface metal film 14 is Hv 400 to Hv 900, for example, and is higher than the hardness of the front surface electrode 12 and the wire 7. If the Ni plating film is formed as the front surface metal film 14 by electroless Ni plating processing, for example, the glossiness of the front surface metal film 14 is about 1.4.

The thickness of the front surface metal film 14 is preferably 3.0 µm or more, and is more preferably 4.5 µm or more. The reason for this will now be described. If the thickness of the front surface metal film 14 is 3.0 µm or more, for example, the following effect is implemented. The strength of the front surface electrode 12 can be improved, hence even if the wire 7, of which main component is aluminum (Al) and of which wire diameter is 450 µm to 550 µm, typically 500 µm or more, is used, the stress applied to the semiconductor chip 1 during wire bonding is relaxed, and the frequency of causing a breakdown of the semiconductor chip 1 can be decreased. Further, the bonding strength and the bonding rate between the front surface metal film 14 and the wire 7, of which metal types are different, can be improved, and the front surface metal film 14 and the wire 7 can be bonded well, with preventing the generation of a bonding failure (unbound portion) in the bonding interface between the front surface metal film 14 and the wire 7.

If the thickness of the front surface metal film 14 is set to 4.5 µm or more, for example, the frequency of causing a breakdown of the semiconductor chip 1 and the bonding strength and the bonding rate between the front surface metal film 14 and the wire 7 can be improved to a degree, equivalent to the bonding of similar metals (e.g. Al electrode and Al wire). Therefore the front surface metal film 14 and the wire 7 can be bonded even better. If the thickness of the front surface metal film 14 is set to about 5.0 µm, for example, the semiconductor 1 does not breakdown (frequency of causing a breakdown of the semiconductor chip 1=0%), and an unbonded portion is not generated in the bonding interface between the front surface metal film 14 and the wire 7 (bonding rate 100%). In this way, the thickness of the front surface metal film 14 is preferably 3.0 µm or more and 7.0 µm or less, more preferably 4.5 µm or more and 7.0 µm or less. As the front surface metal film 14 is thicker, the frequency of causing a breakdown of the semiconductor chip 1 can be decreased, but if it is too thick, the semiconductor chip 1 warps, therefore a thickness not greater than the front surface electrode 12 is preferable considering throughput and economic issues. The thickness of the front surface electrode 12 is preferably 3.0 µm or more and 10.0 µm or less.

The frequency of causing a breakdown of the semiconductor chip 1 refers to a ratio of a number N1 of the semiconductor chips that breaks down (defective products) with respect to the total number N0 of the semiconductor chips manufactured on the manufacturing line (=N1/N0). The bonding rate between the front surface metal film 14 and the wire 7 refers to a ratio of the bonding area S1 between the front surface metal film 14 and the wire 7 with respect to the area S0 of a portion where the front surface metal film 14 and the wire 7 face each other (=S1/S0). In other words, the bonding rate=100% is a state where no bonding failure is generated in the bonded interface between the front surface metal film 14 and the wire 7 (no unbonded portion). The bonding rate between the front surface metal film 14 and the wire 7 will be described in detail later.

One end of the wire 7 is bonded to the front surface metal film 14 by wiring bonding using heat, ultrasonic vibration or pressure (bonding load). The other end of the wire 7 is bonded to the circuit pattern 4 by wire bonding. In other words, the front surface electrode 12 and the circuit pattern 4 are electrically connected by the wire 7. The wire bonding conditions of the wire 7 will be described later. The wire 7 is preferably an Al wire of which main component is Al and of which conductivity has been increased by making the wire diameter thicker, 500 µm or more, for example. Since the wire 7 is thick, heavy current conduction can be implemented, and the heating temperature of the wire 7 during conduction can be reduced, whereby high temperature operation can be implemented. In concrete terms, the wire 7 may be an aluminum alloy wire of which strength has been increased by containing a predetermined amount of iron (Fe). The aluminum alloy wire is a wire constituted by Fe in a 0.2 mass % to 2.0 mass % range, and aluminum (Al) of which purity is 99.99% or more, for example. The wire diameter of the wire 7 is preferably in a 450 µm to 550 µm range, because if the wire diameter exceeds 600 µm, output of wire bonding must be increased and the thickness of the front surface metal film 14 must be increased.

The wire 7 is preferably a high strength wire in which the crystal grain sizes of the wire before wire bonding are controlled to a 1 µm to 20 µm range, for example, whereby the recrystallizing temperature is increased and the strength is improved. By controlling the crystal grain sizes of the wire 7, the recrystallizing temperature of the wire 7 can be increased to 175° C. or more. The crystal grain sizes of the wire 7 in an area near the bonded interface with the bonded members (the front surface metal film 14 and the circuit pattern 4) become finer than before wire bonding because of the wire bonding, and the crystal grain sizes after the wire bonding are in a 1 µm to 15 µm range. In a portion of the wire 7, which is distant from the bonded interface with the bonded members (wire 7 excluding an area near the bonded interface), crystal grain sizes before wire bonding are maintained. By limiting the crystal grain sizes in an area near the bonded interface of the wire 7 immediately after the wire bonding to the above mentioned range, the bonding strength of the wire 7, in the area near the bonded interface with the bonded members, can be improved. The area near the bonded interface of the wire 7 is a portion where cracks can be easily generated depending on the heat history in the manufacturing steps after wire bonding, or on heat during the high temperature operation of the semiconductor element due to conduction heating.

Figure 3:
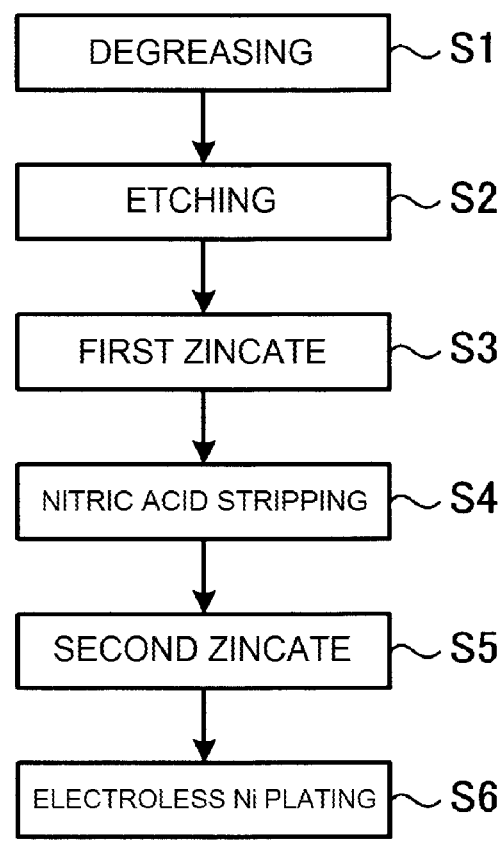
FIG. 3 is a flow chart depicting an overview of a method for manufacturing the semiconductor device according to an embodiment.
Figure 4:
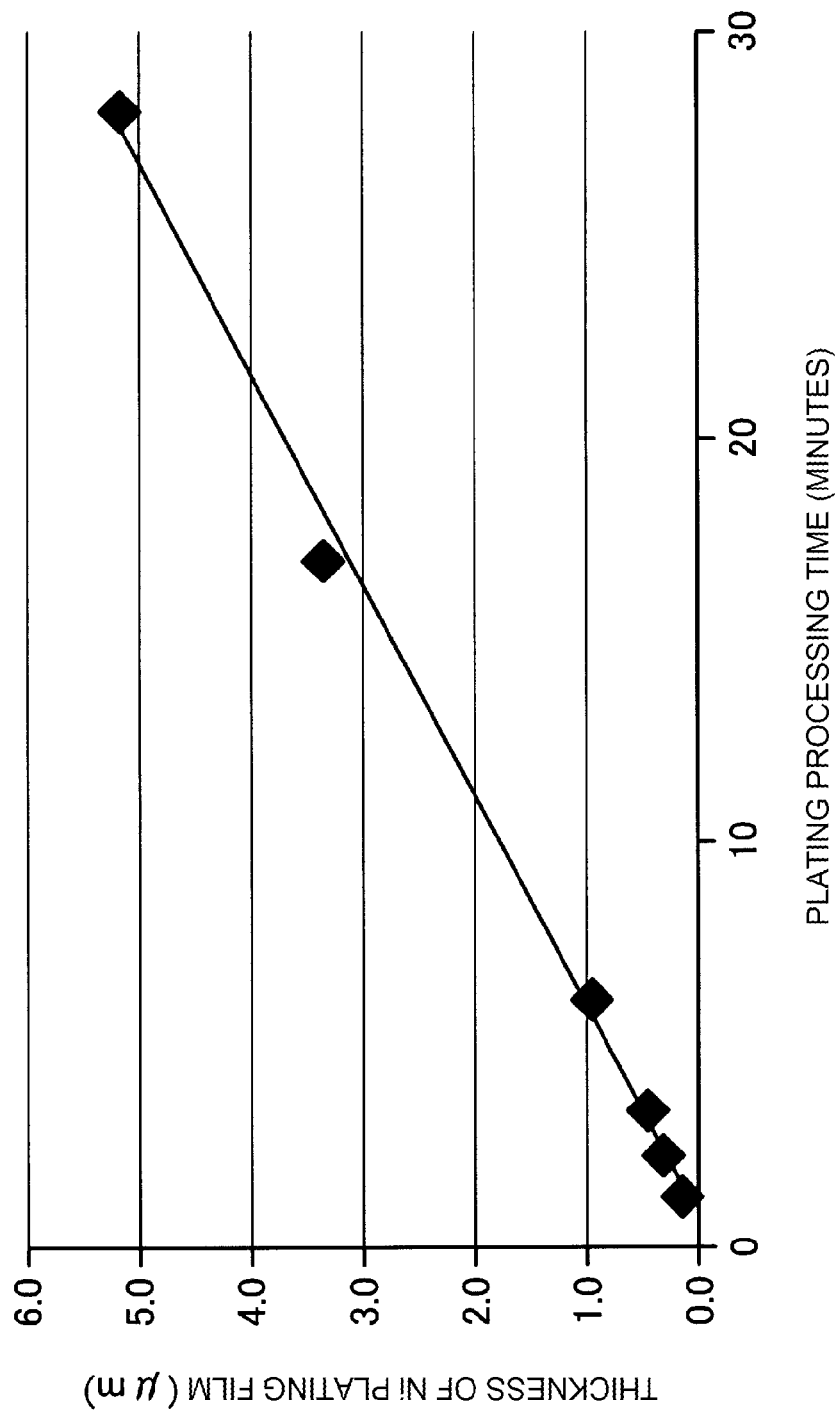
FIG. 4 is a characteristic diagram depicting a relationship between the thickness of a nickel plating film and the plating processing time.

Now a method for depositing (forming) the front surface metal film 14 will be described using an example of depositing an Ni plating film (the front surface metal film 14) on the surface of the Al electrode (front surface electrode 12) by the electroless Ni plating processing. FIG. 3 is a flow chart depicting an overview of the method for manufacturing the semiconductor device according to the embodiment. FIG. 4 is a characteristic diagram depicting the relationship between the thickness of the nickel plating film and the plating processing time. Since the adhesion between the Al electrode and the Ni film is poor, a zincate treatment is normally performed as a pretreatment to the electroless plating processing, so as to improve the adhesion of the Ni plating film to the Al electrode. In concrete terms, a first degreasing treatment is performed on the surface of the front surface electrode 12, where greasy dirt and foreign substances adhering to the surface are removed and cleaned (step S1). In step S1, the wettability of the etchant to the surface of the front surface electrode 12 is improved for the next step. Then the etching processing is performed using an acid solvent (step S2). Thereby a natural oxide film on the surface of the front surface electrode 12 is removed.

Then acid cleaning (desmutting) is performed using a nitric acid ($HNO_3$) solution, and deposits (smut) generated by the etching processing are removed. Then a first zincate treatment is performed, where Al on the surface of the front surface electrode 12 is replaced with zinc (Zn), and a Zn film having the desired crystal grain sizes is generated on the surface of the front surface electrode 12 (step S3). Then the Zn film formed on the surface of the front surface electrode 12 is removed using the nitric acid solution (step S4). Then a second zincate treatment is performed, whereby the Zn film is formed again on the surface of the front surface electrode 12 (step S5). Then the electroless Ni plating processing is performed, where the Zn film is replaced with Ni, and Ni is continuously precipitated on the surface of the front surface electrode 12 so as to form the Ni plating film (step S6). Thereby the Ni plating film is formed on the surface of the front surface electrode 12 as the front surface metal film 14. As shown in FIG. 4, the inventors confirmed that the thickness of the Ni plating film increases in proportion to the plating processing time.

Now the wire bonding conditions of the wire 7 will be described. FIG. 5 is a table showing the semiconductor chip characteristics of a semiconductor device of Example 1 after wire bonding. FIG. 6 is a table showing the semiconductor chip characteristics of a semiconductor device of Comparative Example 1 after wire bonding. FIG. 5 shows a result when a plurality of semiconductor devices, according to the embodiment (hereafter called "Example 1"), is fabricated under different wire bonding conditions, and it is checked whether a semiconductor chip 1 broke down. FIG. 6 shows a result, for comparison, when a plurality of semiconductor devices, where the wire 7 is bonded to the front surface electrode 12 under the wire bonding conditions similar to Example 1 (hereafter called "Comparative Example 1"), is fabricated, and it is checked whether a semiconductor chip 1 broke down.

For both Example 1 and Comparative Example 1, the bonding load during wire bonding is set to 1300 cN, 1400 cN and 1500 cN, and three samples, of which ultrasonic output of wire bonding is 18V, 20V and 22V, are fabricated for each bonding load, whereby a total of nine samples are fabricated under different wire bonding conditions. The bonded member is the front surface metal film 14 in the case of Example 1, and the front surface electrode 12 in the case of Comparative Example 1. In FIG. 5 and FIG. 6, O indicates a case when a semiconductor device is normal, and x indicates a case when a semiconductor device broke down. "Normal" means that the semiconductor device satisfies a predetermined operation standard as a product. And a case when the semiconductor device broke down means that leak current Iges is generated between the gate and the emitter, and the semiconductor device does not satisfy a predetermined operation standard as a product.

The configuration that is common to each sample in Example 1 is as follows. The semiconductor chip 1 of Example 1 is generated by forming a 5.0 μm thick Al electrode (front surface electrode 12) by sputtering on the front surface of an Si wafer of which diameter is 6 inches, and dicing this Si wafer into 10 mm×10 mm chips. A 5.0 μm thick Ni plating film (front surface metal film 14) is formed on the surface of the front surface electrode 12 of the semiconductor chip 1 by electroless Ni plating processing according to the above mentioned method for depositing the front surface metal film 14. Then the wire 7, of which wire diameter is 500 μm, is wire-bonded to the front surface metal film 14 under wire bonding conditions which are different depending on the sample. The wire 7 used here is an aluminum alloy wire of which intensity is improved by controlling the crystal grain sizes before wire bonding to within a 1 μm to 20 μm range, and intensity is enhanced by adding Fe (iron). The configuration of Comparative Example 1 is the same as Example 1 except that the Ni plating film is not formed on the surface of the front surface electrode 12. In other words, in Comparative Example 1, the bonding of the wire 7 and the front surface electrode 12 is bonding between similar metals.

As shown in FIG. 6, in Comparative Example 1, a bonding failure between the wire 7 and the front surface electrode 12 occurred in the samples where wire bonding was performed with a bonding load not greater than 1500 cN and a low ultrasonic output of 18V, resulting in samples that did not operate normally. This is probably because a bonding failure occurred in the entire area of the bonded interface between the wire 7 and the front surface electrode 12 due to a low bonding load and low ultrasonic output. In Example 1, on the other hand, it is confirmed that all examples operated normally (no failure occurred), as shown in FIG. 5. This confirms that by forming the front surface metal film 14 and by increasing the thickness of the front surface metal film 14 as described herein below, the stress applied to the semiconductor chip 1 during wire bonding is relaxed, which prevents the semiconductor chip 1 from breaking down. It is also confirmed that Example 1 can be fabricated by wire bonding of which bonding load and ultrasonic output are lower than Comparative Example 1.

Figure 7:
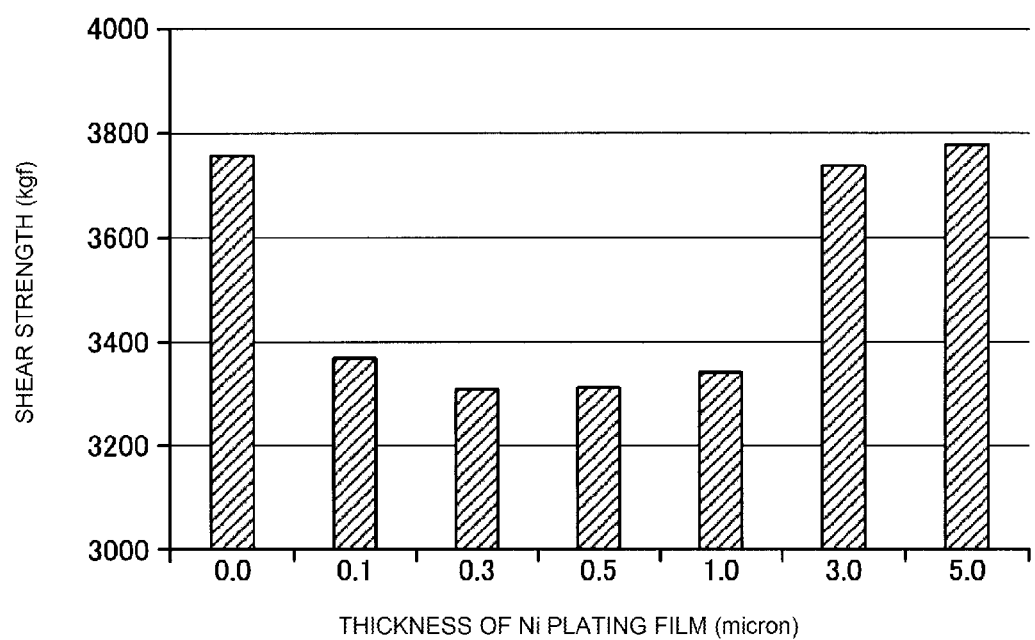
FIG. 7 is a characteristic diagram depicting the bonding strength between the front surface metal film and the wire of a semiconductor device according to Example 2.

Now the bonding strength and the bonding rate between the front surface metal film 14 and the wire 7 will be described. FIG. 7 is a characteristic diagram depicting the bonding strength between the front surface metal film and the wire of the semiconductor device according to Example 2. FIG. 8 is a characteristic diagram depicting the bonding rate between the front surface metal film and the wire of the semiconductor device according to Example 2. FIG. 7 shows a result when a plurality of semiconductor devices according to this embodiment (hereafter called "Example 2") is fabricated with changing the thickness of the front surface metal film 14, and the shear strength of the bonded portion between the front surface metal film 14 and the wire 7 is measured. FIG. 8 shows a result when the bonding rate between the front surface metal film 14 and the wire 7 is calculated for Example 2 after the shear strength is measured.

The thickness of the front surface metal film 14 of each sample of Example 2 is 0.1 µm, 0.3 µm, 0.5 µm, 1.0 µm, 3.0 µm and 5.0 µm respectively. In Example 2, the bonding load and ultrasonic output during wire bonding are 1400 cN and 20 V respectively. The configuration of the front surface metal film 14 of Example 2, other than thickness, is the same as that of Example 1 fabricated under the same wire bonding conditions. In other words, the sample of which thickness of the front surface metal film 14 is 5.0 µm is Example 1, where the bonding load and the ultrasonic output during wire bonding are 1400 cN and 20V respectively. FIG. 7 and FIG. 8 shows Comparative Example 1, which has no front surface metal film 14, as a sample of which thickness of the front surface metal film 14 is 0.0 µm. In FIG. 8, the exact numerical value of the bonding rate is shown above each bar of the graph.

The results shown in FIG. 7 and FIG. 8 confirm that in the case of Comparative Example 1, the frequency of causing a breakdown of the semiconductor chip 1 is high, and many semiconductor chips 1 break down, even if the bonding rate between the front surface electrode 12 and the wire 7 is 95%. It also confirms that if the thickness of the front surface metal film 14 is more than 0.0 µm and less than 3.0 µm, and the bonding strength and the bonding rate between the front surface metal film 14 and the wire 7 are lower than Comparative Example 1, where the wire 7 is directly bonded to the front surface electrode 12. Furthermore, it confirms that if the thickness of the front surface metal film 14 is more than 0.0 µm and less than 3.0 µm, the frequency of causing a breakdown of semiconductor chip 1 is high, and many semiconductor chips 1 break down.

On the other hand, it confirms that if the thickness of the front surface metal film 14 is 3.0 µm or more, the bonding strength and the bonding rate between the front surface metal film 14 and the wire 7 are equivalent to those of Comparative Example 1. In concrete terms, in the sample of which thickness of the front surface metal film 14 is 5.0 µm (Example 1), the shear strength of the bonded portion between the front surface metal film 14 and the wire 7 is 3761 kgf, and the bonding rate between the front surface metal film 14 and the wire 7 is 100%. Therefore results in FIG. 7 and FIG. 8 confirm that if the thickness of the front surface metal film 14 is 3.0 µm or more, good bonding between the front surface metal film 14 and the wire 7, which are different types of metals, is implemented to a level equivalent to the bonding of similar metals.

Figure 9A:
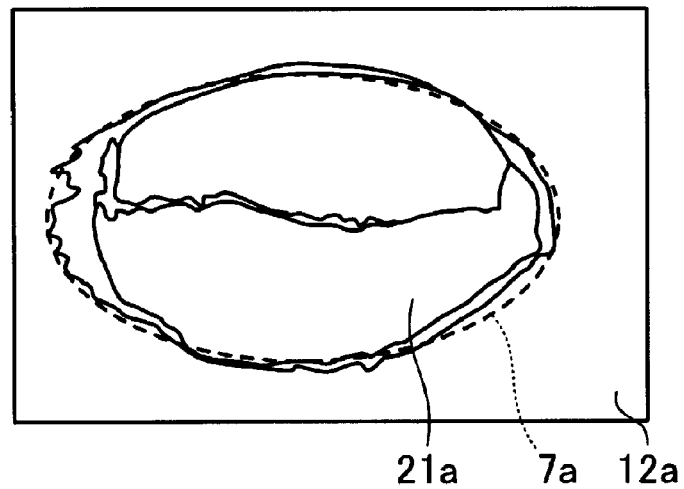
FIG. 9A shows a state of the bonded portion between the front surface electrode (Al electrode) of Comparative Example 1 (no Ni plating film) and the wire (high strength wire)
Figure 9B:
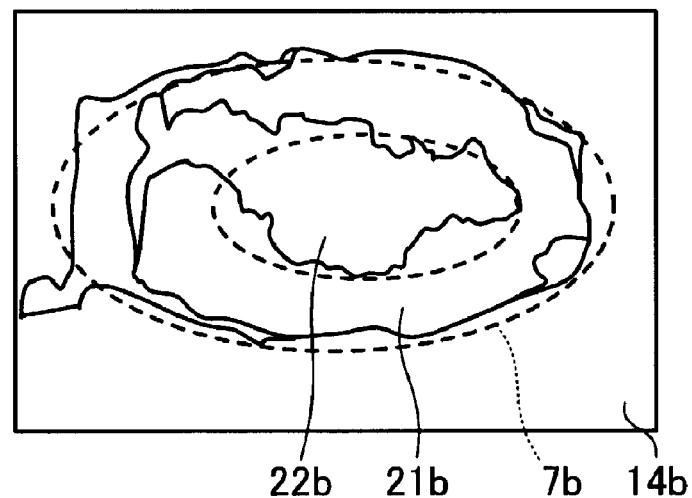
FIG. 9B shows a state of a bonded portion between the front surface metal film of Example 2, of which thickness of the front surface metal film (Ni plating film) is 0.3 µm, and the wire.
Figure 9C:
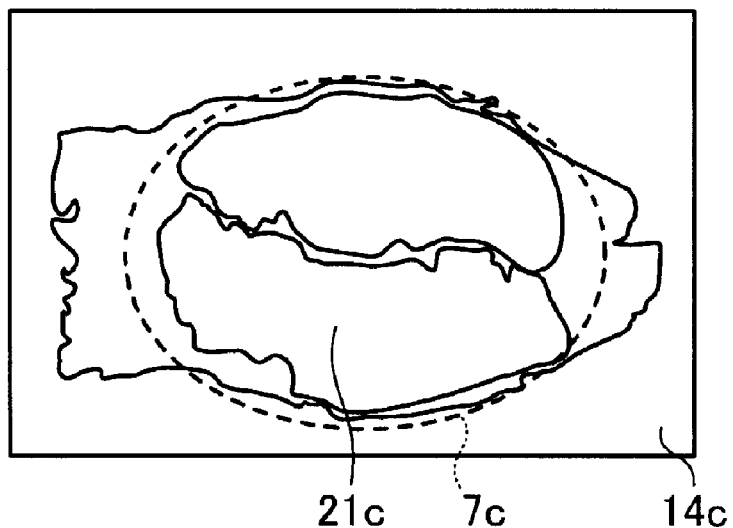
FIG. 9C shows the state of the bonded portion between the front surface metal film of Example 2, of which thickness of the front surface metal film is 5.0 µm, and the wire.

FIG. 9 shows the result when the state of the bonded portion between the front surface metal film 14 and the wire 7 of Example 2, after shear strength measurement, is observed from above (the wire 7 side). FIG. 9 shows plan views schematically depicting the state of the semiconductor device according to Example 2 after shear strength measurement. FIG. 9A shows a state of the bonded portion 21a between the front surface electrode (Al electrode) 12a of Comparative Example 1 (no Ni plating film) and the wire (high strength wire) 7a. FIG. 9B shows a state of a bonded portion 21b between the front surface metal film 14b of Example 2, of which thickness of the front surface metal film (Ni plating film) 14b is 0.3 µm, and the wire 7b. FIG. 9C shows the state of the bonded portion 21c between the front surface metal film 14c of Example 2, of which thickness of the front surface metal film 14c is 5.0 µm, and the wire 7c.

FIG. 9B confirms that if the thickness of the front surface metal film 14b is 0.3 µm, a bonding failure (unbonded portion) 22b is generated in the bonded portion 21b between the front surface metal film 14b and the wire 7b. In this case, the bonding rate between the front surface metal film 14b and the wire 7b is 86%. Thus if the thickness of the front surface metal film 14 is more than 0.0 µm and less than 3.0 µm, a bonding failure is generated in the bonded portion between the front surface metal film 14 and the wire 7. Therefore as FIG. 8 shows, the bonding rate between the front surface metal film 14 and the wire 7 becomes lower than the bonding rate between the front surface electrode 12a and the wire 7a of Comparative Example 1.

On the other hand, if the thickness of the front surface metal film 14c is 5.0 µm as shown in FIG. 9C, a bonding failure is not generated in the bonded portion 21c between the front surface metal film 14c and the wire 7c, and good bonding is implemented (bonding rate between the front surface metal film 14c and the wire 7c=100%), just like Comparative Example 1 (FIG. 9A) where the front surface electrode 12a and the wire 7a are directly bonded. Thus if the thickness of the front surface metal film 14 is 3.0 µm or more, a bonding failure is hardly generated in the bonded portion between the front surface metal film 14 and the wire 7. Therefore as FIG. 8 shows, the bonding rate between the front surface metal film 14 and the wire 7 becomes equivalent to the bonding rate between the front surface electrode 12a and the wire 7a of Comparative Example 1.

Figure 10:
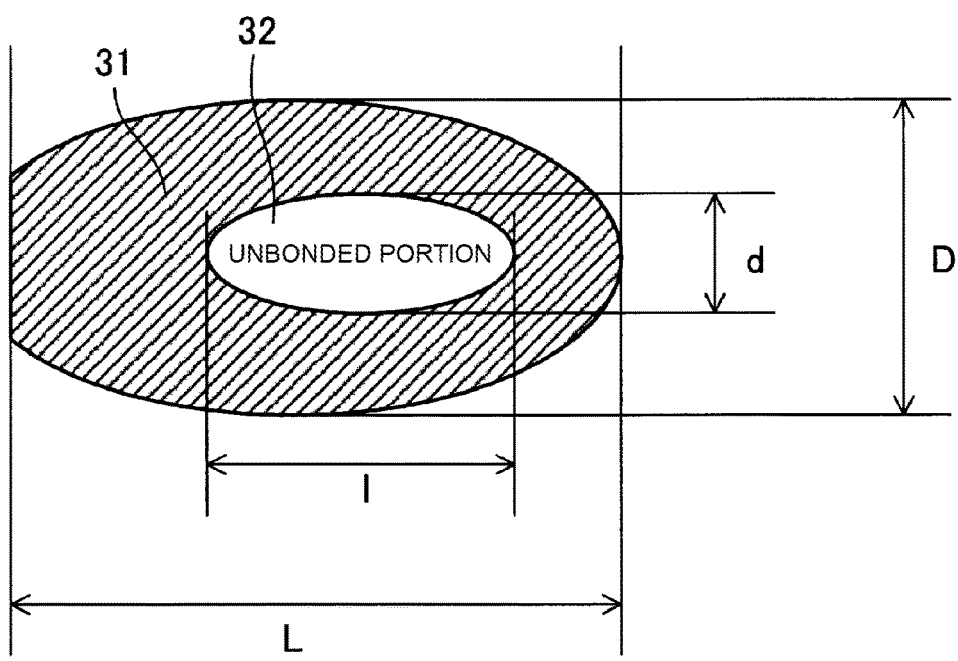
FIG. 10 is a diagram depicting a method for calculating the bonding rate between the front surface metal film and the wire.

Now a method for calculating the bonding rate between the front surface metal film 14 and the wire 7 will be described. FIG. 10 is a diagram depicting a method for calculating the bonding rate between the front surface metal film and the wire. As shown in FIG. 10, it is assumed that the planar shape of the bonded portion 31 between the front surface metal film 14 and the wire 7 (planar shape of the edge of the wire 7) is an ellipse, of which long diameter is L and short diameter is D, for example. And it is assumed that the planar shape of the portion where the front surface metal film 14 and the wire 7 are not bonded (unbonded portion) 32 in the bonded portion 31 is an ellipse of which long diameter is l and short diameter is d. In this case, the bonding rate between the front surface metal film 14 and the wire 7 is given by the following Expression (1). In other words, the bonding rate between the front surface metal film 14 and the wire 7 is an area ratio of the portion (hatched portion) where the front surface metal film 14 and the wire 7 are bonded (contacted), with respect to the area of the bonded portion 31 when the unbonded portion 32 does not exist.

Math. 1:

$$\text{Bonding ratio} = \frac{(L \times D) - (l \times d)}{(L \times D)} \times 100 \tag{1}$$

Figure 11A:
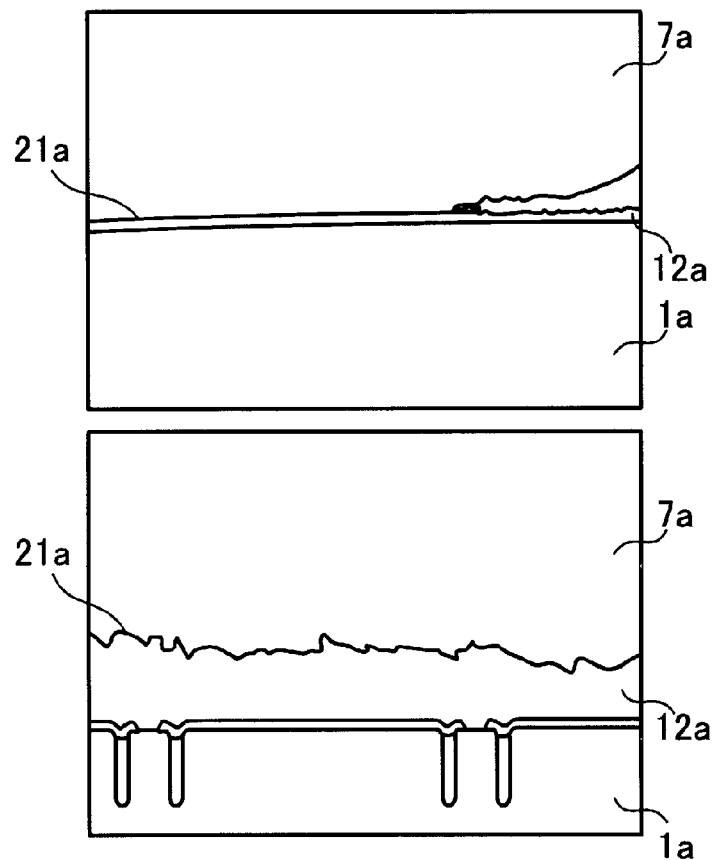
FIG. 11A shows a sectional surface of the bonded portion between the front surface electrode and the wire of FIG. 9B.
Figure 11B:
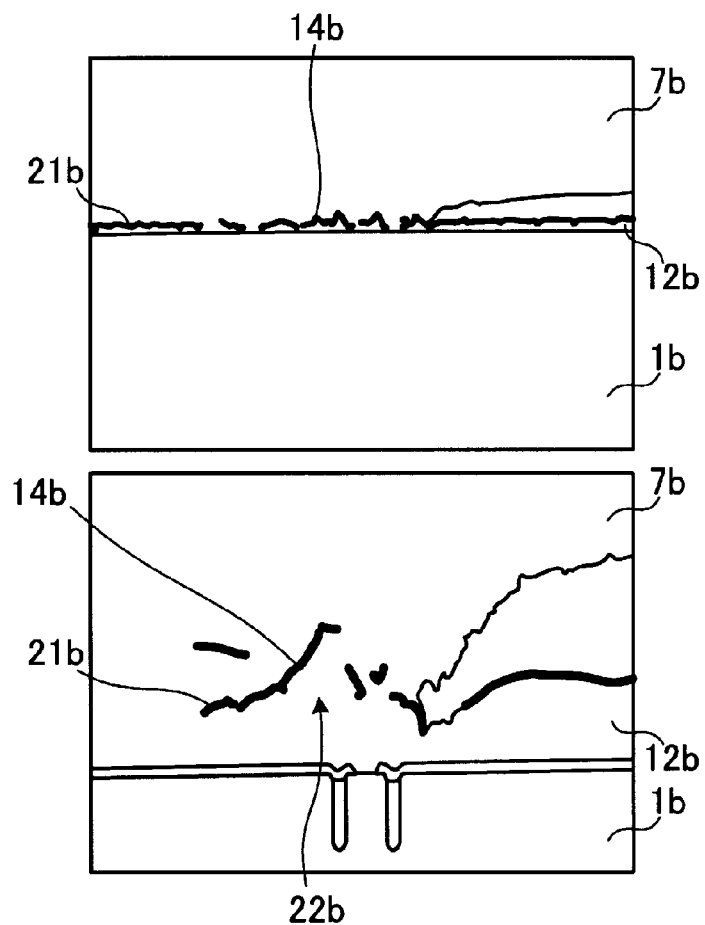
FIG. 11B shows a sectional surface of the bonded portion between the front surface metal film and the wire of FIG. 9B.
Figure 11C:
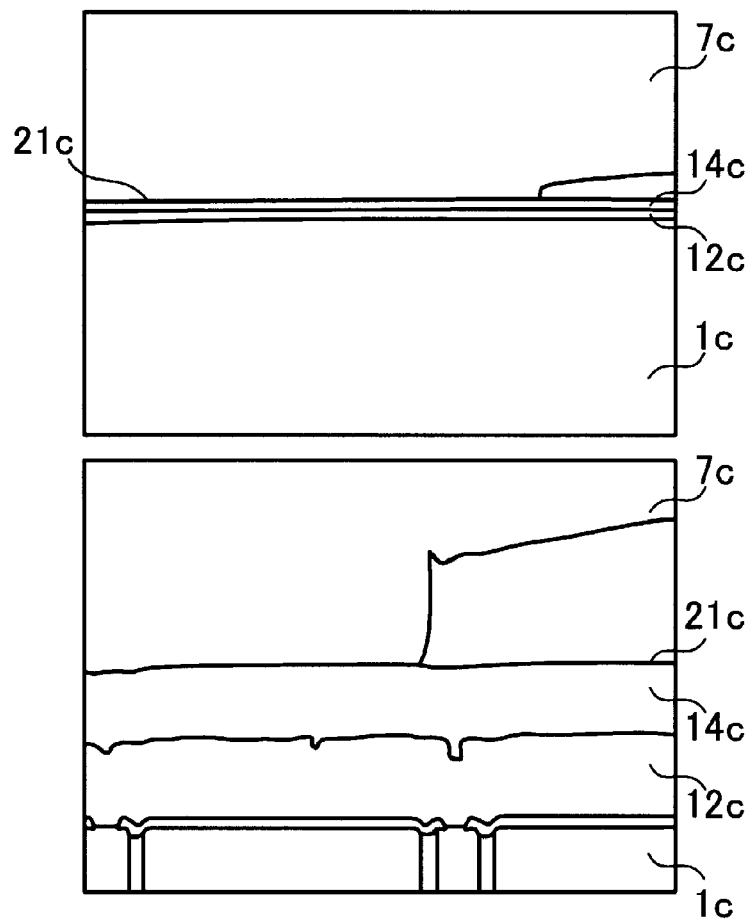
FIG. 11C shows a sectional surface of the bonded portion between the front surface metal film and the wire of FIG. 9B.

FIG. 11 shows the result of observing the state of the cross-section of the bonded portion between the front surface metal film 14 and the wire 7 of Example 2. FIG. 11 is a cross-sectional view schematically depicting the state of the semiconductor device according to Example 2 after bonding. FIG. 11A shows a sectional surface of the bonded portion 21a between the front surface electrode 12a and the wire 7a of FIG. 9A (Comparative Example 1). FIG. 11B shows a sectional surface of the bonded portion 21b between the front surface metal film 14b and the wire 7b of FIG. 9B (Example 2, where thickness of the front surface metal film 14 is 0.3 μm). FIG. 11C shows a sectional surface of the bonded portion 21c between the front surface metal film 14c and the wire 7c of FIG. 9C (Example 2, where thickness of the front surface metal film 14 is 5.0 μm). In FIG. 11A to FIG. 11C, the lower drawing is an enlarged view of the upper drawing. Reference symbols 1a to 1c denote the semiconductor chip, and reference symbols 12a to 12c denote the front surface electrode.

FIG. 11B confirms that if the thickness of the front surface metal film 14b is 0.3 μm, cracks are generated in the front surface metal film 14b after bonding, and a bonding failure 22b is generated in the cracked area of the bonded portion 21b between the front surface metal film 14b and the wire 7b. In the cracked area of the front surface metal film 14b, the front surface electrode 12b and the wire 7b face each other, and the front surface metal film 14b and the wire 7b are not bonded (not contacted) (interface between the front surface electrode 12b and the wire 7b is not illustrated). Thus it is confirmed that if the thickness of the front surface metal film 14 is more than 0.0 μm and less than 3.0 μm, cracks are generated in the front surface metal film 14, and a bonding failure is generated in the bonded portion between the front surface metal film 14 and the wire 7.

On the other hand, if the thickness of the front surface metal film 14c is 5.0 μm, as shown in FIG. 11C, cracks are not generated in the front surface metal film 14c. And a bonding failure is not generated in the bonded portion 21c between the front surface metal film 14c and the wire 7c, just like the bonded portion 21a between the front surface electrode 12a and the wire 7a of Comparative Example 1 (FIG. 11A). Thus it is confirmed that if the thickness of the front surface metal film 14 is 3.0 μm or more, generation of cracks in the front surface metal film 14 can be prevented, therefore generation of a bonding failure in the bonded portion between the front surface metal film 14 and the wire 7, due to cracks, can be prevented.

Figure 12:
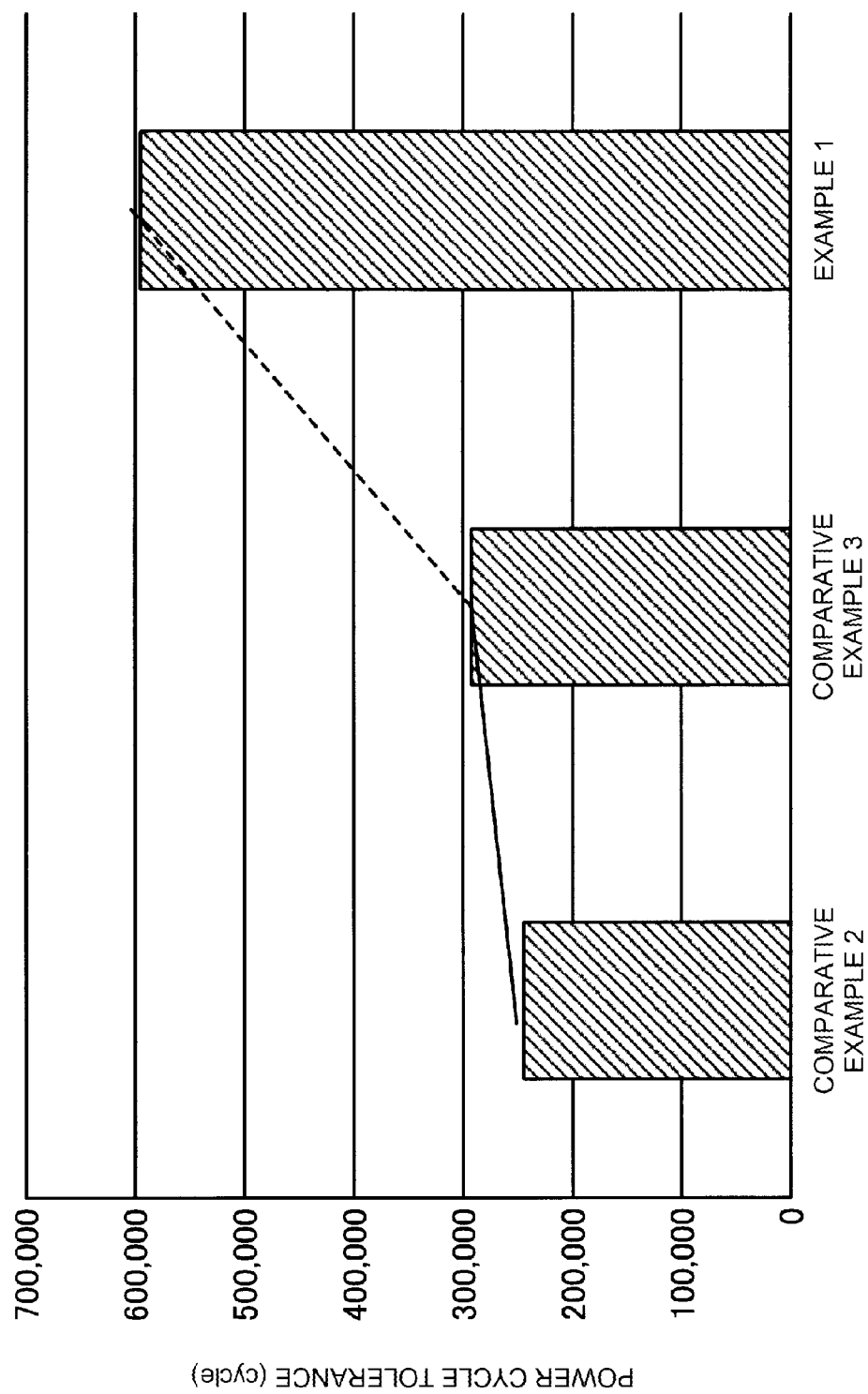
FIG. 12 is a characteristic diagram depicting the power cycle tolerance of the semiconductor device according to Example 1.
Figure 13:
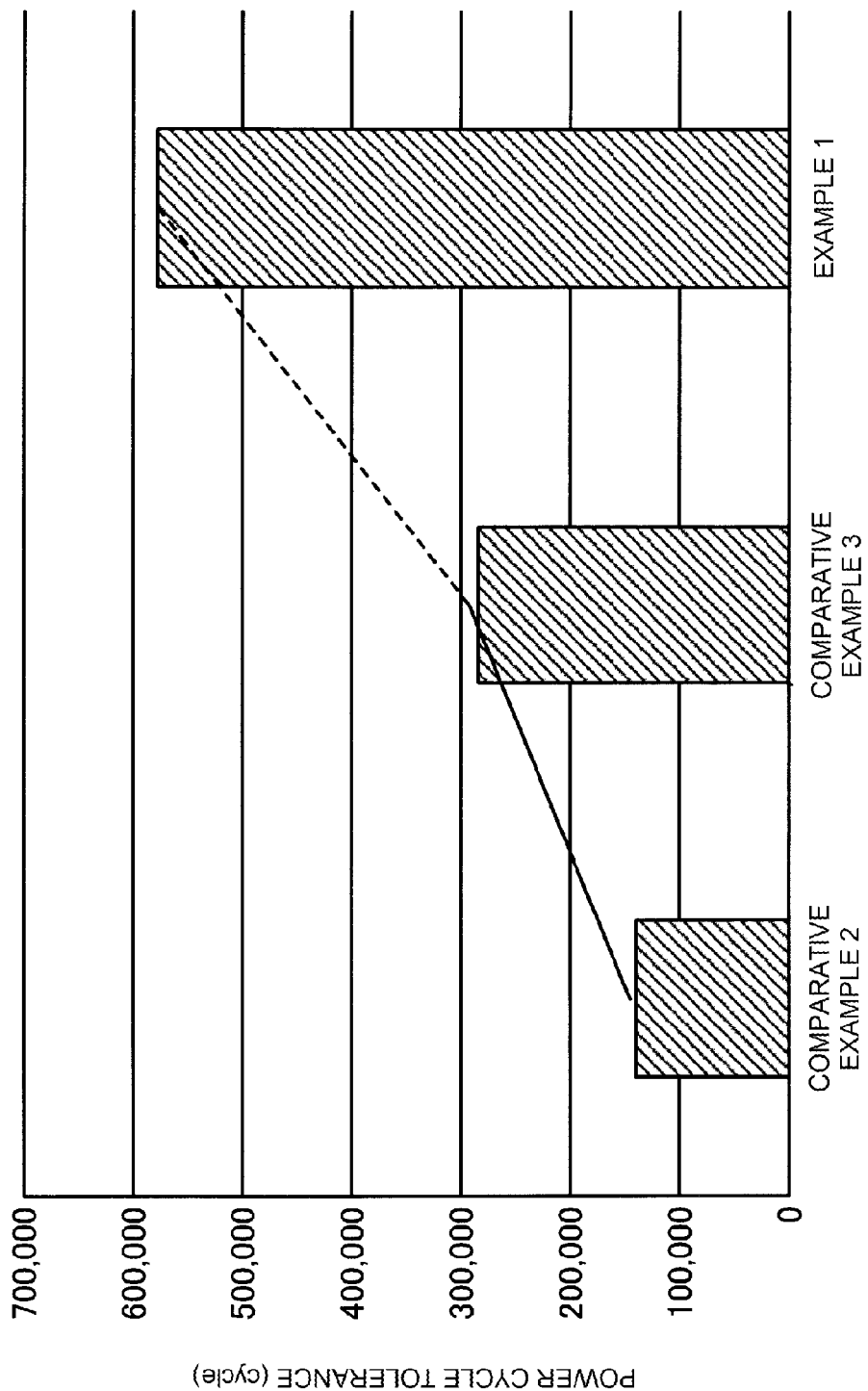
FIG. 13 is a characteristic diagram depicting the power cycle tolerance of the semiconductor device according to Example 1.
Figure 14:
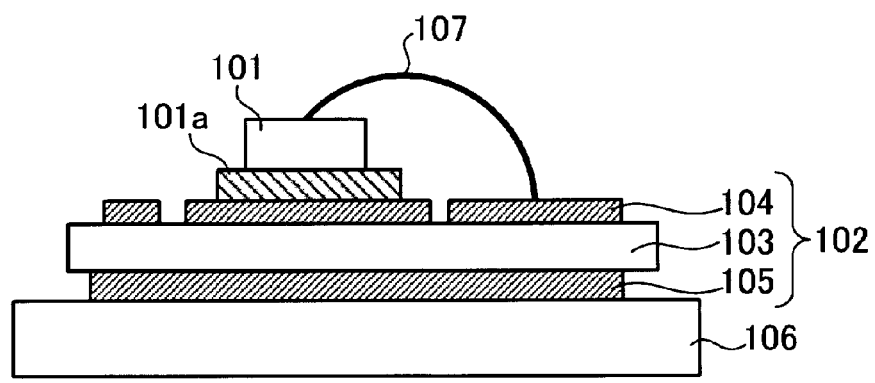
FIG. 14 is a cross-sectional view depicting a structure of a conventional semiconductor device having a module structure.
Figure 15:
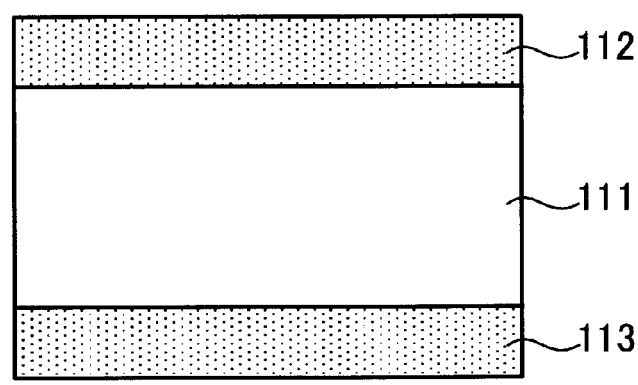
FIG. 15 is a cross-sectional view schematically depicting the structure of the semiconductor element in FIG. 14.

Now the wire diameter of the wire 7 will be described. FIG. 12 and FIG. 13 are characteristic diagrams depicting the power cycle tolerance of the semiconductor device according to Example 1. FIG. 12 and FIG. 13 show the result when the power cycle test is conducted on Example 1, where the bonding load and the ultrasonic output during the wire bonding are 1400 cN and 20 V respectively. FIG. 12 shows the power cycle tolerance of Example 1 when the current density per unit wire is 16.7 A. FIG. 13 shows the power cycle tolerance of Example 1 when the current density per unit wire is 25.0 A. In the power cycle test, the temperature change $\Delta Tj$ of the bonding temperature of the semiconductor element, that is generated by the intermittent flow of the current, is 75° C.

For comparison, FIG. 12 and FIG. 13 show the power cycle tolerance of the semiconductor devices where standard Al wires are wire-bonded (hereafter called "Comparative Examples 2 and 3"). Comparative Example 2 is a semiconductor device where a standard Al wire (wire diameter: 400 μm) is wire-bonded to the front surface metal film 14 under wire bonding conditions similar to Example 1. Comparative Example 3 is a semiconductor device where a standard Al wire (wire diameter: 500 μm) is wire-bonded to the front surface metal film 14 under wire bonding conditions similar to Example 1. The configurations of Comparative Examples 2 and 3 are the same as Example 1, except that an Al wire is used.

The results shown in FIG. 12 and FIG. 13 confirm that if the current density per unit wire is 16.7 A, then the power cycle tolerance of Comparative Example 2 and the power cycle tolerance of Comparative Example 3 are virtually the same, and the influence of the wire diameter of the wire 7 on the power cycle tolerance is minimal. On the other hand, it is confirmed that if the current density per unit wire is increased (current density: 25.0 A), then the difference between the power cycle tolerance of Comparative Example 2 and the power cycle tolerance of Comparative Example 3 increases, and the influence of the wire diameter of the wire 7 on the power cycle tolerance increases. However it is confirmed that in the case of Comparative Example 3, the bonding load and the ultrasonic output during wire bonding must be increased more so than Comparative Example 2, and the semiconductor chip 1 breaks down by increasing the bonding load and the ultrasonic output during wire bonding (not illustrated).

On the other hand, it is confirmed that in the case of Example 1, life duration can be improved than Comparative Example 3 which uses a standard Al wire. In concrete terms, if the current density per unit wire is 16.7 A, the power cycle tolerance of Example 1, Comparative Example 2 and Comparative Example 3 is 600 kcycles, 247 kcycles and 297 kcycles respectively. And if the current density per unit wire is 25.0 A, the power cycle tolerance of Example 1, Comparative Example 2 and Comparative Example 3 is 570 kcycles, 137 kcycles and 281 kcycles. Therefore it is confirmed that the semiconductor device according to the present invention can implement heavy current conduction and high temperature operation, and improve life duration.

As described above, according to the embodiment, the front surface metal film having a thickness of 3.0 μm or more, of which major component is Ni, is formed on the surface of the front surface electrode of which major component is Al, and the wire of which major component is Al is bonded to this front surface metal film by wire bonding using ultrasonic vibration, whereby the bonding strength and the bonding rate between the front surface metal film and the wire can be increased to a level equivalent to the bonding of similar metals. Since this ensures a good bonding state between the front surface metal film and the wire constituted by different types of metals, separation of the wire can be prevented, and the life duration of the semiconductor device can be improved. Furthermore, according to the embodiment, the strength of the wire can be improved and the wire recrystallizing temperature can be raised by limiting the crystal grain sizes of the wire to a 1 μm to 20 μm range, for example. Thereby cracking of the wire or breaking and separation of the wire due to thermal load of the power cycle can be prevented, therefore the life duration of the semiconductor device can be improved. As a consequence, according to the embodiment, a highly reliable semiconductor device implementing heavy current conduction and high temperature operation can be provided by using a wire with high conductivity of which wire diameter is 500 μm or more.

Numerous modifications can be made to the present invention, and the dimensions of each component in each of the above embodiments, for example, can be set in accordance to demanded specifications.

INDUSTRIAL APPLICABILITY

As described above, the semiconductor device according to the present invention is useful for semiconductor devices having a module structure, which are used for general-purpose invertors, wind power generation, solar power generation and electric railroads.

| Explanation of Reference Numerals: | |
|---|---|
| 1 | semiconductor chip |
| 2 | insulated substrate |
| 3 | insulating layer |
| 4 | circuit pattern |
| 5 | rear copper foil |
| 6 | Cu base |
| 7 | wire |
| 8 | solder bonding layer |
| 11 | semiconductor substrate |
| 12 | front surface electrode |
| 13 | rear surface electrode |
| 14 | front surface metal film |

What is claimed is:

1. A semiconductor device having a module structure including a circuit pattern and a semiconductor element disposed on the circuit pattern that are electrically connected to one another with a wire, comprising:
   a conducting unit that is disposed on a surface of the semiconductor element; and
   a metal film that is comprised of a metal having nickel as a main component, that is disposed on a surface of the conducting unit and to which one end of said wire is ultrasonically bonded using ultrasonic vibration, that has a degree of hardness that is greater than that of the conducting unit, and that has a thickness ranging from 3 µm to 7 µm,
   wherein said wire is comprised of an aluminum alloy containing aluminum as the main component with a purity of 99.99 percent or more, and iron present in a range of 0.2 mass percent to 2.0 mass percent,
   wherein the wire has a wire diameter ranging from 500 µm up to but less than 600 µm, and is comprised of a wire area near a bonded interface between the wire and the metal film and a wire area excluding the wire area near the bonded interface after wire bonding,
   wherein the wire area near the bonded interface has a crystal grain size that ranges between 1 µm to 15 µm, the wire area excluding the wire area near the bonded interface has a crystal grain size that ranges between 1 µm to 20 µm, and the crystal grain size of the wire area near the bonded interface is finer than the crystal grain size of the wire area excluding the wire area near the bonded interface, and
   wherein the bonded interface between the wire and the metal film has a bond strength for dissimilar metals that is equivalent to that for similar metals.

2. The semiconductor device according to claim 1, wherein the semiconductor element includes a semiconductor substrate selected from a silicon substrate comprised of silicon and a silicon carbide substrate comprised of silicon carbide, and wherein the conducting unit is comprised of aluminum as a major component and is disposed on the surface of the semiconductor substrate.

3. The semiconductor device according to claim 1, wherein the metal film is a nickel alloy film comprising nickel as a main component and at least one of phosphorus and boron.

4. A semiconductor device having a module structure including a circuit pattern comprised of copper and a semiconductor element disposed on the circuit pattern that are electrically connected to one another with a wire, comprising:
   a front surface electrode disposed on a front surface of the semiconductor element; and
   a front surface metal film that is disposed on a front surface of the front surface electrode, that is comprised of a metal having nickel as a main component, that has a degree of hardness that is greater than that of the front surface electrode, that has a thickness ranging from 3 µm to 7 µm, and to which one end of the wire is ultrasonically bonded using ultrasonic vibration;
   wherein said wire is comprised of an aluminum alloy having aluminum as a main component with the aluminum having a purity of 99.99 percent or more, and containing iron present in a range of 0.2 mass percent to 2.0 mass percent, and has a wire diameter ranging from 500 µm up to but less than 600 µm, and
   wherein the one end of the wire and the metal film has a bonded interface that has a bond strength for dissimilar metals that is at least equivalent to that for similar metals.

5. The semiconductor device according to claim 4, wherein the wire is comprised of a wire area near the bonded interface between the wire and the front surface metal film and a wire area excluding the wire area near the bonded interface after wire bonding, and wherein the wire area near the bonded interface has a crystal grain size that ranges between 1 µm to 15 µm, the wire area excluding the wire area near the bonded interface has a crystal grain size that ranges between 1 µm to 20 µm, and the crystal grain size of the wire area near the bonded interface is finer than the crystal grain size of the wire area excluding the wire area near the bonded interface.

6. The semiconductor device according to claim 4, wherein the semiconductor element includes a semiconductor substrate selected from a silicon substrate comprised of silicon and a silicon carbide substrate comprised of silicon carbide, and the front surface electrode is comprised of aluminum as a major component.

7. The semiconductor device according to claim 6, wherein the front surface metal film is comprised of a nickel alloy having nickel as a main component and containing at least one of phosphorus and boron.

* * * * *